(12) United States Patent
Nicol

(10) Patent No.: US 9,590,629 B2
(45) Date of Patent: Mar. 7, 2017

(54) LOGICAL ELEMENTS WITH SWITCHABLE CONNECTIONS

(71) Applicant: Wave Semiconductor, Inc., Campbell, CA (US)

(72) Inventor: Christopher John Nicol, Campbell, CA (US)

(73) Assignee: Wave Computing, Inc., Campbell, CA (US)

( * ) Notice: Subject to any disclaimer, the term of this patent is extended or adjusted under 35 U.S.C. 154(b) by 0 days.

(21) Appl. No.: 14/530,624

(22) Filed: Oct. 31, 2014

(65) Prior Publication Data

US 2015/0123707 A1 May 7, 2015

Related U.S. Application Data

(60) Provisional application No. 61/899,180, filed on Nov. 2, 2013.

(51) Int. Cl.
*H03K 19/0175* (2006.01)
*H03K 19/177* (2006.01)

(52) U.S. Cl.
CPC . *H03K 19/017581* (2013.01); *H03K 19/1776* (2013.01); *H03K 19/17764* (2013.01)

(58) Field of Classification Search
CPC ....... H03K 19/17736; H03K 19/17756; H03K 19/177; H03K 19/1731; H03K 19/17704; H03K 19/17748; H03K 19/17752; H03K 19/17728; H03K 19/17744; H03K 19/17776; H03K 19/017581; H03K 19/1776; H03K 19/17796; H03K 19/018585; H03K 19/018592; H03K 5/135; G06F 17/5054; G06F 15/7867; G06F 7/32; G06F 7/764; G06F 1/04; H05K 1/0286; H05K 2201/10212
See application file for complete search history.

(56) References Cited

U.S. PATENT DOCUMENTS 6,134,605 A * 10/2000 Hudson et al. ................. 710/13
6,363,470 B1 * 3/2002 Laurenti et al. .............. 711/220
7,193,994 B1 * 3/2007 Payson ..................... H04L 7/02
370/380

(Continued)

FOREIGN PATENT DOCUMENTS

JP 2005165961 A 12/2003
WO WO2009131569 A1 10/2009

OTHER PUBLICATIONS

International Search Report dated Feb. 6, 2015 for PCT/US2014/063591.

*Primary Examiner* — Alexander H Taningco
*Assistant Examiner* — Seokjin Kim
(74) *Attorney, Agent, or Firm* — Adams Intellex, PLC

(57) ABSTRACT

Clusters of logical elements are interconnected by a switching fabric. Each cluster contains processing elements, storage elements, and switching elements. A circular buffer within a cluster contains multiple switching instructions to control the flow of data throughout the switching fabric. The circular buffer provides a pipelined execution of switching instructions. Each cluster contains multiple processing elements, and each cluster further comprises an additional circular buffer for each processing element. Logical operations are controlled by the circular buffers.

33 Claims, 8 Drawing Sheets

(56) References Cited

U.S. PATENT DOCUMENTS

| | | |
|---|---|---|
| 8,314,636 B2 | 11/2012 | Hutton et al. |
| 8,341,469 B2 | 12/2012 | Miyama et al. |
| 8,908,709 B1 * | 12/2014 | Aybay ................. H04L 49/1546 |
| | | 370/351 |
| 2007/0133399 A1 | 6/2007 | Gangwal |
| 2009/0089605 A1 * | 4/2009 | Westwick et al. ............ 713/340 |
| 2010/0013517 A1 * | 1/2010 | Manohar et al. ................ 326/38 |
| 2010/0281448 A1 | 11/2010 | He |
| 2011/0199117 A1 * | 8/2011 | Hutchings et al. ............ 326/38 |
| 2012/0119781 A1 | 5/2012 | Manohar et al. |
| 2012/0235839 A1 * | 9/2012 | Mazumdar et al. .... H04L 49/40 |
| | | 341/50 |
| 2012/0319730 A1 | 12/2012 | Fitton et al. |
| 2013/0009666 A1 | 1/2013 | Hutton et al. |
| 2013/0009667 A1 | 1/2013 | Calhoun et al. |
| 2013/0043902 A1 | 2/2013 | Rahim et al. |
| 2013/0339778 A1 * | 12/2013 | Smentek et al. ........ G06F 13/42 |
| | | 713/600 |
| 2014/0075144 A1 * | 3/2014 | Sanders et al. ............... 711/170 |

\* cited by examiner

LOGICAL ELEMENTS WITH SWITCHABLE CONNECTIONS

RELATED APPLICATIONS

This application claims the benefit of U.S. provisional patent application "Logical Elements with Switchable Connections" Ser. No. 61/899,180, filed Nov. 2, 2013. The foregoing application is hereby incorporated by reference in their entirety.

FIELD OF ART

This application relates generally to logic circuitry and more particularly to logical elements with switchable connections.

BACKGROUND

Semiconductor devices are vastly complex structures. Various semiconductors, including application specific integrated circuits (ASICs), are designed with a certain purpose in mind. As a downside of the specific design parameters of an ASIC, the circuit can no longer be altered after it leaves the production line. For this reason, ASIC designers need to be sure of their design, especially when producing large quantities of the same ASIC. In contrast, a programmable logic device such as a field programmable gate array (FPGA) is also a type of semiconductor, but does not have specific programming built into the design during production. Programmable logic devices often can be reprogrammed while remaining in their environment of use (e.g. while mounted on the circuit board within which the device is intended to function). Programmable logic devices typically include logic blocks (e.g. programmable Boolean logic gates) and can also include programmable memory blocks, programmable clocking blocks, and other specialized programmable blocks such as multiplier blocks and I/O ports.

Typically, programmable logic devices are programmed using a programming language used to implement specific, desired logic in the programmable logic devices. The programmable logic devices can be programmed by writing data to storage on the programmable logic devices. A programmable logic device architecture includes a programmable routing structure and an array of configurable logic blocks. The programmable routing matrix includes an ability to connect configurable logic blocks to each other.

Programmable logic devices allow adaptability to future (unforeseen) changes in functional requirements. In some cases, programmable logic devices are used as prototypes for ASIC or other devices. Using a programmable logic device to prototype an ASIC for verification and initial software development is a useful way to both decrease development time and reduce the risk of first silicon failure for the ASIC. Programmable logic devices function well in many applications such as digital video, graphics processing, communications, encryption, medical equipment, mobile computing, and instrumentation, areas which are all continuing to play an important role in the implementation of many new programmable logic designs.

SUMMARY

Logical elements, including processing elements, storage elements, and switching elements, are arranged into clusters. Clusters are arranged in groups interconnected by a structure referred to as a switching fabric. The switching fabric includes logical elements, such as switching elements. Each cluster contains circular buffers which contain configuration instructions for the cluster. The instructions within a circular buffer allow the switching elements to be controlled. The instructions within the buffer reconfigure the logical elements, thus allowing for a dynamic programmable logic device.

An apparatus for data manipulation is disclosed comprising: a plurality of logical elements, configurable connections between the logical elements, and a circular buffer controlling the configurable connections. The circular buffer is programmed and instructions are pre-processed to generate input to the circular buffer for dynamic programming. The circular buffer can include one, two, three, or more switch instruction entries per column. In embodiments, a computer-implemented method implements logic to form the switching fabric and circular buffer controlling the configurable connections.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Programmable logic devices such as FPGAs have wide applicability due to FPGAs' flexibility and ability to be reprogrammed within their operating environment. While an FPGA can be reprogrammed, a given program only allows the FPGA to remain in a certain logical arrangement to accomplish a specific logical task. In contrast, embodiments disclosed herein provide an improved programmable logic device capable of executing a series of logic operations by dynamic reconfiguration using instructions stored in a circular buffer. For example, one program can stored in the circular buffer that is attached to logical elements. As the circular buffer rotates, different instructions from the stored program are executed, allowing the logical elements and interconnections to perform different operations based on the instructions in the circular buffer without changing programs.

Embodiments disclosed herein provide clusters of logical elements. The logical elements can include processing elements, storage elements, and switching elements. The processing elements can also include processor cores capable of executing machine instructions. The storage elements can include registers, caches, and/or on chip memories. The switching elements can include bus control circuits, which can be configured to route data on a bus from one cluster to another cluster.

Figure 1:
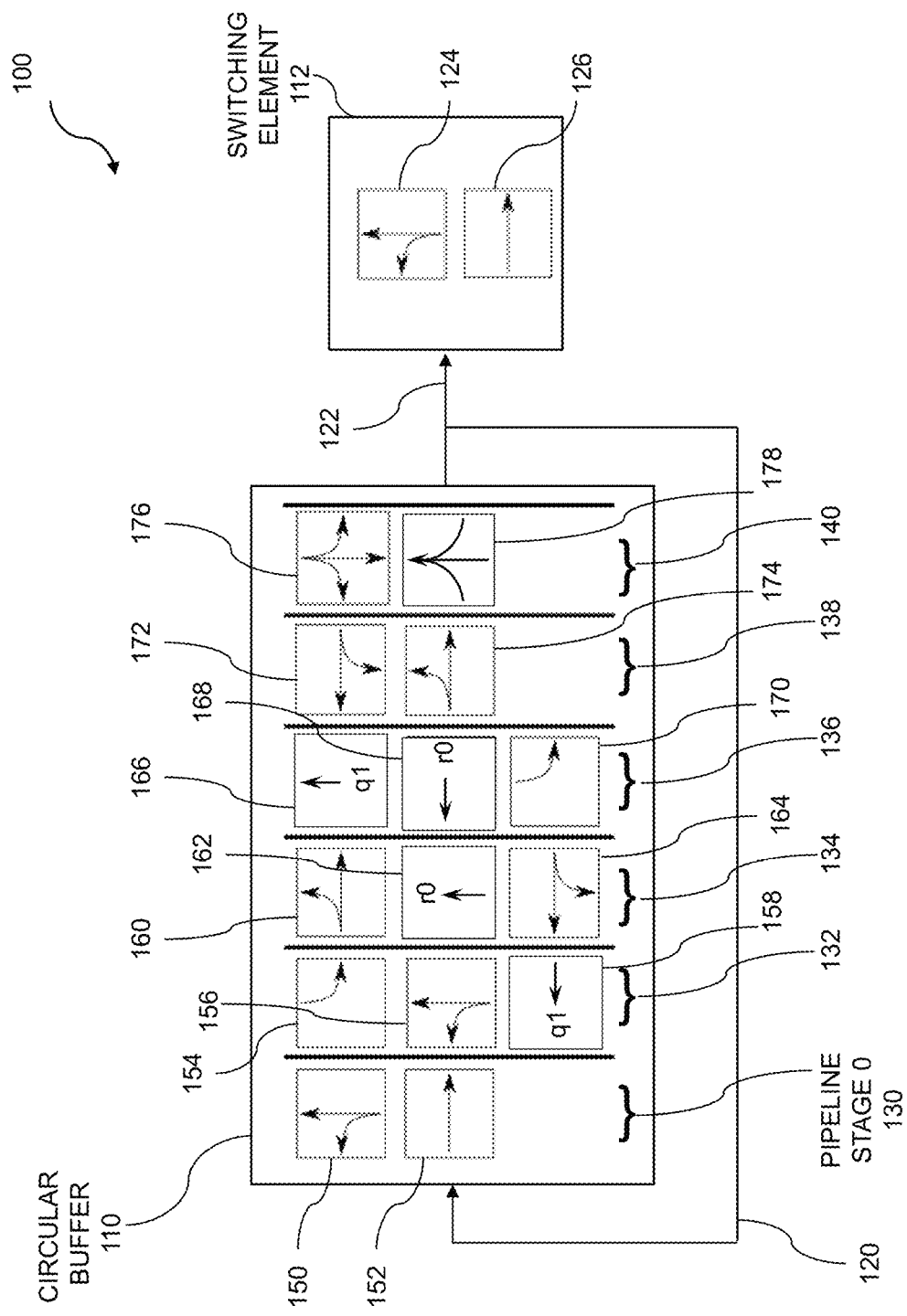
FIG. 1 is a block diagram of a circular buffer.

FIG. 1 is a block diagram 100 of a circular buffer 110 and a corresponding switching element 112. The block diagram 100 describes an apparatus for data manipulation. The circular buffer 110 contains a plurality of pipeline stages. Each pipeline stage contains one or more instructions, up to a maximum instruction depth. In the embodiment shown in FIG. 1, the circular buffer 110 is a 6×3 circular buffer, meaning that it implements a six stage pipeline with an instruction depth of up to three instructions per stage (column). Hence, the circular buffer 110 can include one, two, or three switch instruction entries per column. In some embodiments, the plurality of switch instructions per cycle can comprise two or three switch instructions per cycle. However, in certain embodiments, the circular buffer 110 supports only a single switch instruction in a given cycle. In the example 100 shown, Pipeline Stage 0 130 has an instruction depth of two instructions 150 and 152. Though the remaining pipeline stages 1-5 are not textually labeled in the FIG. 100, the stages are indicated by callouts 132, 134, 136, 138 and 140. Pipeline stage 1 132 has an instruction depth of three instructions 154, 156, and 158. Pipeline stage 2 134 has an instruction depth of three instructions 160, 162, and 164. Pipeline stage 3 136 also has an instruction depth of three instructions 166, 168, and 170. Pipeline stage 4 138 has an instruction depth of two instructions 172 and 174. Pipeline stage 5 140 has an instruction depth of two instructions 176 and 178. In embodiments, the circular buffer 110 includes 64 columns.

During operation, the circular buffer 110 rotates through configuration instructions. The circular buffer 110 can dynamically change operation of the logical elements based on the rotation of the circular buffer. The circular buffer 110 can comprise a plurality of switch instructions per cycle for the configurable connections.

The instruction 152 is an example of a switch instruction. In embodiments, each cluster has four inputs and four outputs, each designated within the cluster's nomenclature as "north," "east," "south," and "west" respectively. For example, the instruction 152 in the diagram 100 is a west-to-east transfer instruction. The instruction 152 directs the cluster to take data on its west input and send out the data on its east output. In another example of data routing, the instruction 150 is a fan-out instruction. The instruction 150 instructs the cluster to take data on its south input and send out on the data on both its north output and its west output. The arrows within each instruction box indicate the source and destination of the data. The instruction 178 is an example of a fan-in instruction. The instruction 178 takes data from the west, south, and east inputs and sends out the data on the north output. Therefore, the configurable connections can be considered to be time multiplexed.

In embodiments, the clusters implement multiple storage elements in the form of registers. In the example 100 shown, the instruction 162 is a local storage instruction. The instruction 162 takes data from the instruction's south input and stores it in a register (r0). The instruction 168 is a retrieval instruction. The instruction 168 takes data from the register (r0) and outputs it on the instruction's west output. Some embodiments utilize four general purpose registers, referred to as registers r0, r1, r2, and r3. The registers are, in embodiments, storage elements which store data while the configurable connections are busy with other data. In embodiments, the storage elements are 32-bit registers. In other embodiments, the storage elements are 64-bit registers. Other register widths are possible.

In embodiments, the clusters implement multiple processing elements in the form of processor cores, referred to as cores q0, q1, q2, and q3. In embodiments, four cores are used, though any number of cores can be implemented. The instruction 158 is a processing instruction. The instruction 158 takes data from the instruction's east input and sends it to a processor q1 for processing. The processors can perform logic operations on the data, including, but not limited to, a shift operation, a logical AND operation, a logical OR operation, a logical NOR operation, a logical XOR operation, an addition, a subtraction, a multiplication, and a division. Thus, the configurable connections can comprise one or more of a fan-in, a fan-out, and a local storage.

In the example 100 shown, the circular buffer 110 rotates instructions in each pipeline stage into switching element 112 via a forward data path 122, and also back to a pipeline stage 0 130 via a feedback data path 120. Instructions can include switching instructions, storage instructions, and processing instructions, among others. The feedback data path 120 can allow instructions within the switching element 112 to be transferred back to the circular buffer. Hence, the instructions 124 and 126 in the switching element 112 can also be transferred back to pipeline stage 0 as the instructions 150 and 152. In addition to the instructions depicted on FIG. 1, a no-op instruction or a sleep instruction can also be inserted into a pipeline stage. In embodiments, a no-op instruction causes execution to not be performed for a given cycle. In effect, the introduction of a no-op instruction can cause a column within the circular buffer 110 to be skipped in a cycle. In contrast, not skipping an operation indicates that a valid instruction is being pointed to in the circular buffer. A sleep state can be accomplished by not applying a clock to a circuit, performing no processing within a processor, removing a power supply voltage or bringing a power supply to ground, storing information into a non-volatile memory for future use and then removing power applied to the memory, or by similar techniques. A sleep instruction that causes no execution to be performed until a predetermined event occurs which causes the logical element to exit the sleep state can also be explicitly specified. The predetermined event can be the arrival or availability of valid data. The data can be determined to be valid using null convention logic (NCL). In embodiments, only valid data can flow through the switching elements and Xs (invalid data points) are not propagated by instructions.

In some embodiments, the sleep state is exited based on an instruction applied to a switching fabric. The sleep state can, in some embodiments, only be exited by stimulus external to the logical element and not based on the programming of the logical element. The external stimulus can include an input signal, which in turn can cause a wake up or an interrupt service request to execute on one or more of the logical elements. An example of such a wake up request can be seen in the instruction 158, assuming that the processor q1 was previously in a sleep state. In embodiments, when the instruction 158 takes valid data from the east input and applies that data to the processor q1, the processor q1 wakes up and operates on the received data. In the event that the data is not valid, the processor q1 can remain in a sleep state. At a later time, data can be retrieved from the q1 processor, e.g. by using an instruction such as the instruction 166. In the case of the instruction 166, data from the processor q1 is moved to the north output. In some embodiments, if Xs have been placed into the processor q1, such as during the instruction 158, then Xs would be retrieved from the processor q1 during the execution of the instruction 166 and applied to the north output of the instruction 166.

A collision occurs if multiple instructions route data to a particular port in a given pipeline stage. For example, if instructions 152 and 154 are in the same pipeline stage, they will both send data to the east output at the same time, thus causing a collision since neither instruction is part of a time-multiplexed fan-in instruction (such as the instruction 178). To avoid potential collisions, certain embodiments use preprocessing, such as by a compiler, to arrange the instructions in such a way that there are no collisions when the instructions are loaded into the circular buffer. Thus, the circular buffer 110 can be statically scheduled in order to prevent data collisions. In embodiments, when the preprocessor detects a data collision, the scheduler changes the order of the instructions to prevent the collision. Alternatively or additionally, the preprocessor can insert further instructions such as storage instructions (e.g. the instruction 162), sleep instructions, or no-op instructions, to prevent the collision. Alternatively or additionally, the preprocessor can replace multiple instructions with a single fan-in instruction. For example, if a first instruction sends data from the south input to the north output and a second instruction sends data from the west input to the north output in the same pipeline stage, the first and second instruction can be replaced with a fan-in instruction that routes the data from both of those inputs to the north output in a deterministic way to avoid a data collision. In this case, the machine can guarantee that valid data is only applied on one of the inputs for the fan-in instruction.

Figure 2:
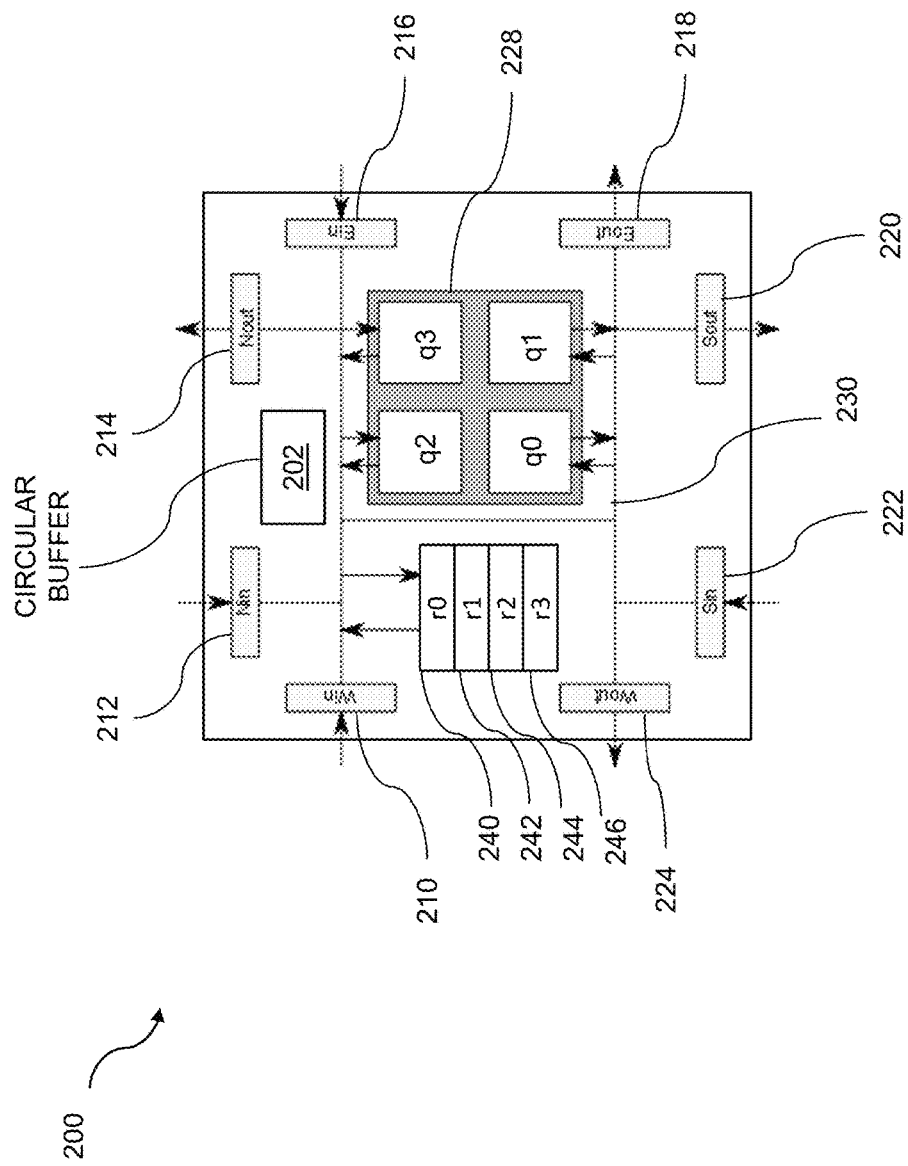
FIG. 2 is an example cluster for course-grained reconfigurable processing.

FIG. 2 is an example cluster 200 for course-grained reconfigurable processing. The cluster 200 comprises a circular buffer 202, which operates similarly to the circular buffer 110 of FIG. 1. The circular buffer 202 can be referred to as a main circular buffer or a switch-instruction circular buffer. In some embodiments, the cluster 200 comprises additional circular buffers corresponding to processing elements within the cluster. The additional circular buffers can be referred to as processor instruction circular buffers. The example cluster 200 comprises a plurality of logical elements, configurable connections between the logical elements, and a circular buffer 202 controlling the configurable connections. The logical elements can further comprise one or more of switching elements, processing elements, or storage elements. The example cluster 200 also comprises four processing elements (q0, q1, q2, and q3). The four processing elements can collectively be referred to as a "quad," and jointly indicated by a grey reference box 228. In embodiments, there is intercommunication among and between each of the four processing elements. In embodiments, the circular buffer 202 controls the passing of data to the quad of processing elements 228 through switching elements. In embodiments, the four processing elements 228 comprise a processing cluster. In some cases, the processing elements can be placed into a sleep state. In embodiments, the processing elements wake up from a sleep state when valid data is applied to the inputs of the processing elements. In embodiments, the individual processors of a processing cluster share data and/or instruction caches. The individual processors of a processing cluster can implement message passing via a bus or shared memory interface. Power gating can be applied to one or more processors (e.g. q1) in order to reduce power.

The cluster 200 can further comprise storage elements coupled to the configurable connections. As shown, the cluster 200 comprises four storage elements (r0 240, r1 242, r2 244, and r3 246). The cluster 200 futher comprises a north input (Nin) 212, a north output (Nout) 214, an east input (Ein) 216, an east output (Eout) 218, a south input (Sin) 222, a south output (Sout) 220, a west input (Win) 210, and a west output (Wout) 224. The circular buffer 202 can contain switch instructions that implement configurable connections. For example, an instruction such as the instruction 160 in FIG. 1 effectively connects the west input 210 with the north output 214 and the east output 218 and this routing is accomplished via bus 230. The cluster 200 can further comprise a plurality of circular buffers residing on a semiconductor chip where the plurality of circular buffers control unique, configurable connections between the logical elements.

As stated previously, the preprocessor can be configured to prevent data collisions within the circular buffer 202. The prevention of collisions can be accomplished by inserting no-op or sleep instructions into the circular buffer (pipeline). Alternatively, in order to prevent a collision on an output port, intermediate data can be stored in registers for one or more pipeline cycles before being sent out on the output port. In other situations the preprocessor can change one switching instruction to another switching instruction to avoid a conflict. For example, in some instances the preprocessor can change an instruction placing data on the west output 224 to an instruction placing data on the south output 220, such that the data can be output on both output ports within the same pipeline cycle. In a case where data needs to travel to a cluster that is both south and west of the cluster 200, it can be more efficient to send the data directly to the south output port rather than storing the data in a register and sending the data to the west output on a subsequent pipeline cycle.

Figure 3:
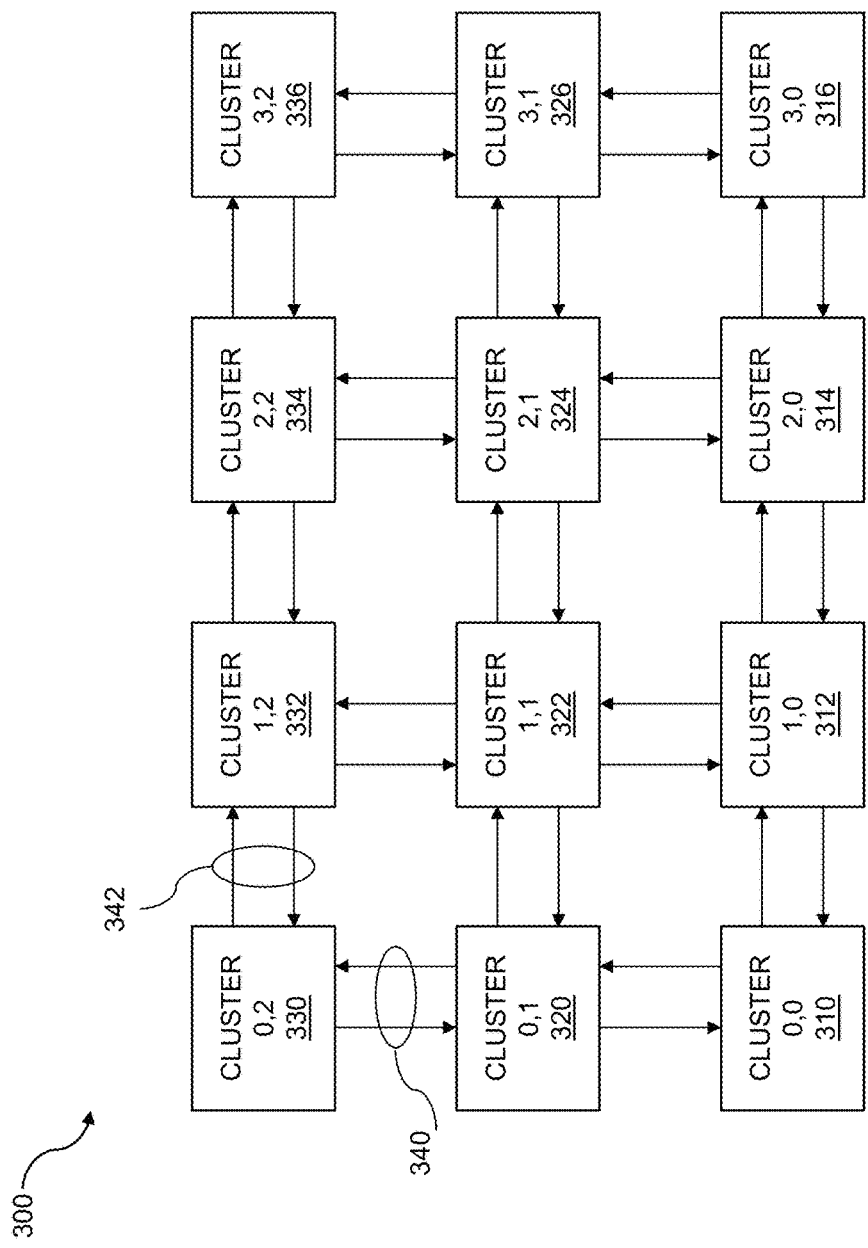
FIG. 3 shows an example fabric of clusters.

FIG. 3 shows a diagram 300 indicating an example fabric of clusters. A cluster 330 has a cluster 332 to its east and a cluster 320 to its south. The cluster 330 exchanges data 340 with the southerly cluster 320 by using a south output connected to a north input of the cluster 320. Similarly, a south input of the cluster 330 is connected to a north output of the cluster 320. The cluster 330 exchanges data 342 with the cluster 332 oriented to the first cluster's west by using an east output connected to a west input of the second cluster 332. Similarly, an east input of cluster 330 is connected to a west output of cluster 332. In embodiments, the switching fabric is implemented with a parallel bus, such as a 32-bit bus. Other bus widths are possible, including, but not limited to, 16-bit, 64-bit, and 128-bit buses. Therefore, the configurable connections can provide for routing of a plurality of signals in parallel. In embodiments, the plurality of signals comprise four bytes. Communication through the configurable connections can be based on data being valid.

The fabric of clusters shown in FIG. 3 is a two-dimensional (2D) fabric, illustrating a mesh interconnection network where the clusters are placed in a two-dimensional grid. Each cluster is connected to its immediate neighbors as described in the case of the previously mentioned clusters as well as other clusters 310, 312, 314, 316, 322, 324, 326, 334, and 336. Hence, in embodiments, the switching fabric is used in mesh computing. Other embodiments have a fabric of more than two dimensions. The configurable connections can provide three-dimensional routing. A three-dimensional (3D) embodiment can have additional cluster interconnectivity. In one embodiment, the 3D fabric is formed by layering multiple 2D mesh interconnect fabrics. The three-dimensional routing can include accessing a stacked chip. The stacked chip can be a 3D-integration integrated circuit where multiple die are stacked and interconnected with through-silicon vias. In the case of three-dimensional routing, each cluster can have additional input and output ports. For example, in addition to the north, south, east, and west I/O ports, sets of up and down I/O ports can be present in each cluster to allow connectivity to clusters situated above and below a certain cluster. In embodiments, the configurable connections comprise a switching fabric that is attached to a plurality of processing elements. The configurable connections can route through one or more of silicon vias, two-dimensional connections, three-dimensional connections, or connections with more than three dimensions. For example, a setup such as a hypercube can allow for greater than three-dimensional interconnectivity. With n-dimensional hypercubes, the interconnection topology can comprise a plurality of clusters and a plurality of links, with "n" being an integer greater than or equal to three. Each cluster has a degree "n," meaning that it is connected with links to "n" other clusters. The configurable connections can enable the bypassing of neighboring logical elements. In embodiments, some or all of the clusters in the fabric have a direct connection to a non-adjacent (non-neighboring) cluster. Within the fabric, each cluster of the plurality of clusters can have its own circular buffer. Therefore, the example diagram 300 includes a plurality of circular buffers. The plurality of circular buffers can have differing lengths. For example, the cluster 330 can have a circular buffer of X length, while the cluster 332 can have a circular buffer with a length of X+Y. In such a configuration, the cluster 330 sleeps after execution of the X−1 stage until the cluster 332 executes the X+Y−1 stage, at which point the plurality of circular buffers having differing lengths can resynchronize with the zeroth pipeline stage for each of the plurality of circular buffers. In an example where X=6 and Y=2, after the execution of the fifth stage of FIG. 1 140, the cluster 330 sleeps until the cluster 332 executes the seventh stage, at which point both pipelines resynchronize and start executing the same stage together. The clusters (310-336) can be configured to function together to process data and produce a result. The result can be stored in one of the storage elements of one of the clusters. In some embodiments, the result is stored across multiple clusters.

Figure 4:
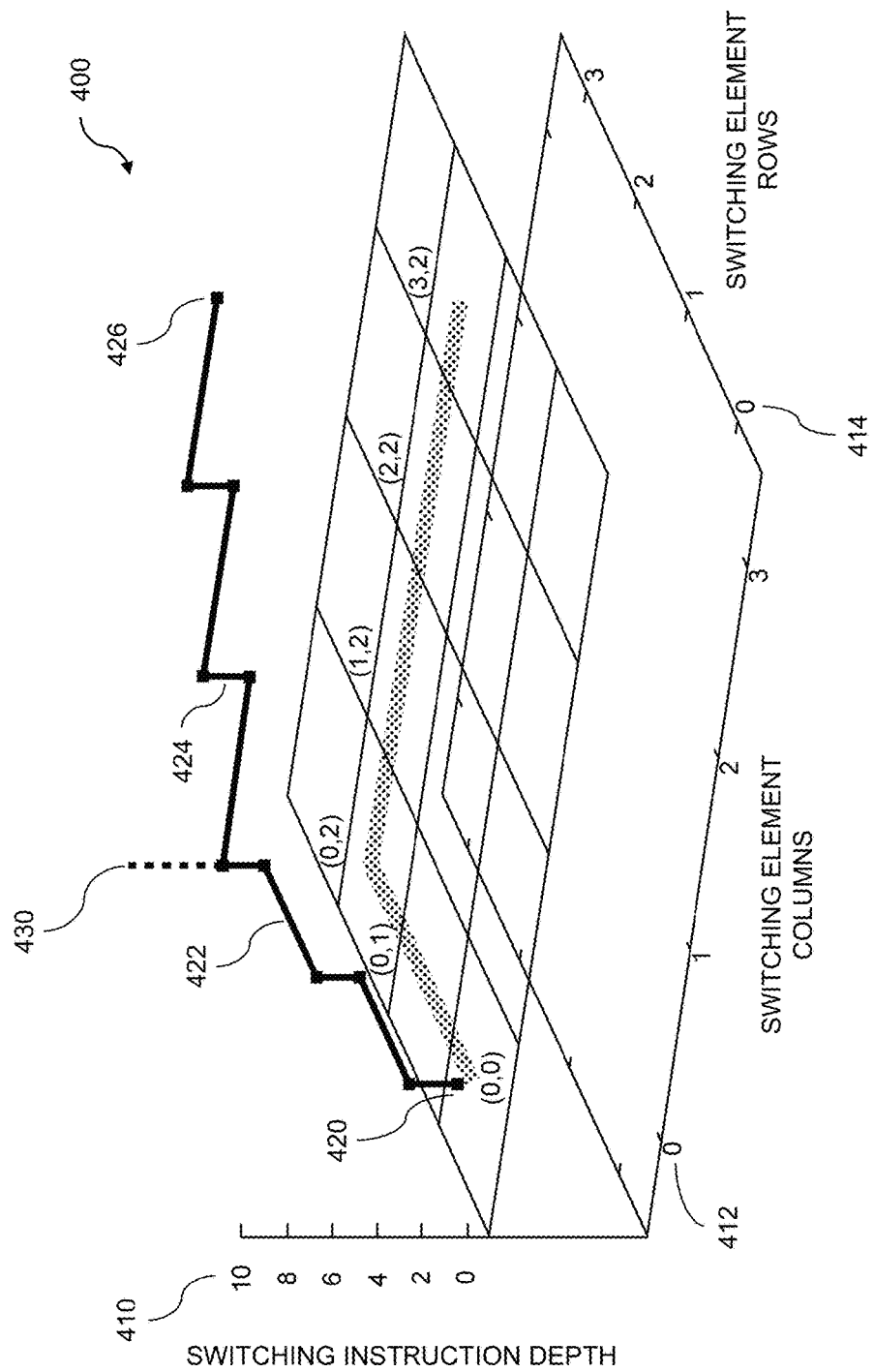
FIG. 4 shows example point-to-point routing.

FIG. 4 shows a chart 400 indicating an example point-to-point routing. The vertical axis 410 indicates switching instruction depth. The X axis 412 indicates switching element columns. The Y axis 414 indicates switching element rows. A curve 422 depicts an exemplary data transfer. The exemplary data transfer starts at the point (0,0) 420, which in the example given represents the cluster 310 of FIG. 3. In the subsequent pipeline cycle, the data is transferred to another cluster, at the point (0,1) on the graph, representing the cluster 320 of FIG. 3. In the subsequent pipeline cycle, the data is transferred to a third cluster, at the point (0, 2) on the graph, representing the cluster 330 of FIG. 3. In the subsequent pipeline cycle, the data is transferred to a fourth cluster, at the point (1,2) on the graph, representing the cluster 332 of FIG. 3. and indicated by the point 424 in the chart 400. In the subsequent pipeline cycle, the data is transferred to a fifth cluster, at the point (2, 2) on the graph, representing the cluster 334 of FIG. 3. Finally, in the last pipeline cycle, the data is transferred to a sixth cluster, at the point (3, 2) on the graph, representing the cluster 336 of FIG. 3. and indicated by the point 426 in the chart 400. A vertical line 430 indicates a potential transfer delay. If a cluster is not ready to accept data, the data can be stored in a register (e.g. the register 240 of FIG. 2) for multiple cycles.

Figure 5:
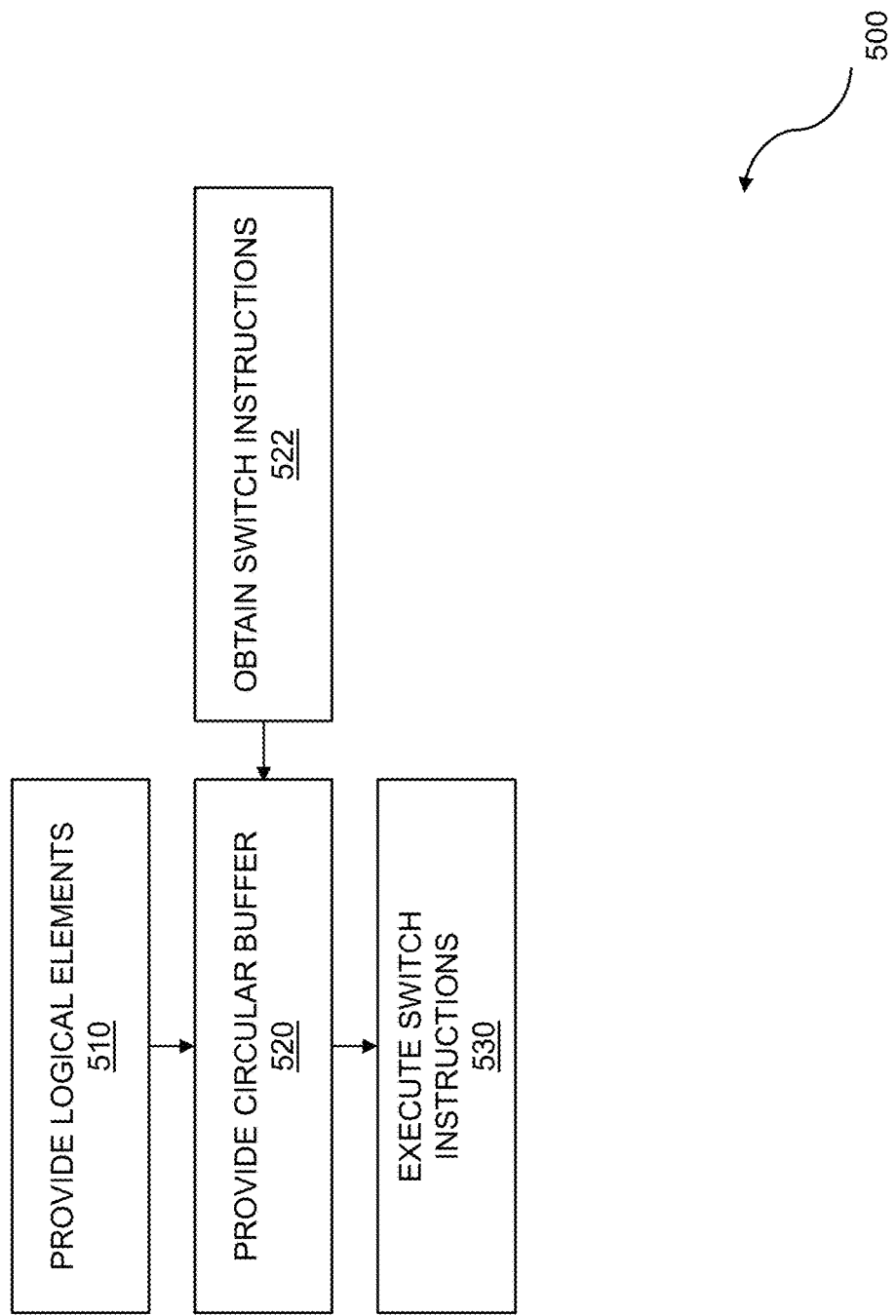
FIG. 5 is a flow diagram for implementing and using logic.

FIG. 5 is a flow diagram 500 for implementing and using logic. The flow comprises a computer-implemented method of logic implementation. The flow 500 can provide logical elements 510. The logical elements can include processing elements, storage elements, and switching elements. In embodiments, the logical elements are grouped into clusters. Each cluster can comprise one or more processing elements, storage elements, and switching elements. As shown, the flow 500 continues with providing a circular buffer 520. The circular buffer can have a length and a depth. The length can determine the number of pipeline stages. The depth can determine the number of instructions per pipeline stage. In embodiments, the circular buffer provides between six and 12 pipeline stages, with a depth of three instructions. In embodiments, the circular buffer length is programmable. The programmability can be accomplished by providing additional circuitry, such as muxes, to configure the circular buffer to a desired length. The circular buffer can be programmed and instructions can be pre-processed to generate input to the circular buffer for dynamic programming. The flow 500 continues with obtaining switch instructions 522. The switch instructions can be obtained from a preprocessor and/or compiler which generate the switch instructions for the implementation of a particular function. The switch instructions can be loaded into the circular buffer. The flow 500 continues with executing the switch instructions 530. The switch instructions can be loaded into switching elements within the clusters to configure connections to other clusters such that data can be transferred between and among the clusters. The flow can include designing a switching fabric using a plurality of logical elements, configurable connections between the logical elements, and a circular buffer controlling the configurable connections.

Figure 6:
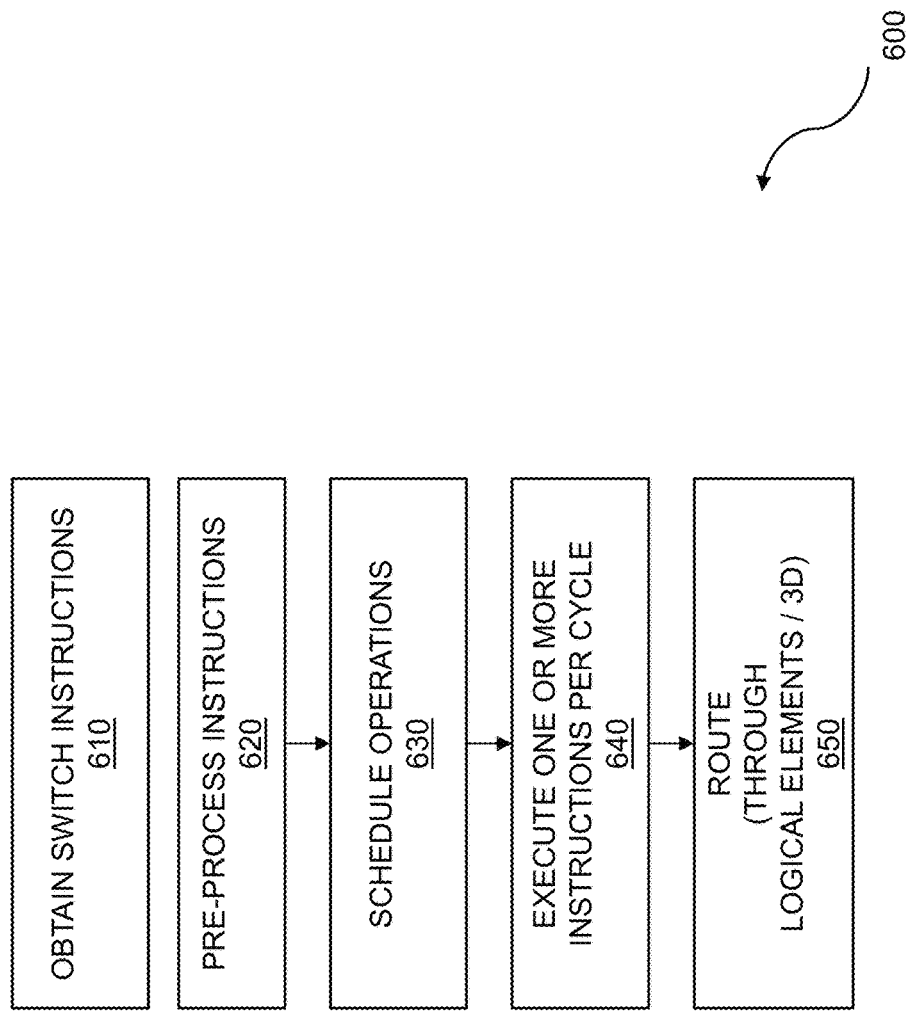
FIG. 6 is a flow diagram for the programming and use of a circular buffer.

FIG. 6 is a flow diagram 600 for the programming and use of a circular buffer. The flow 600 includes obtaining switch instructions 610. The switch instructions can be obtained from a computer system executing a compiler. The flow 600 continues with preprocessing the instructions 620. In embodiments, the preprocessing includes conflict checking. The flow 600 continues with scheduling operations 630. The flow 600 continues with executing one or more instructions per cycle 640. The order in which operations are placed in a circular buffer can determine the order of execution of the instructions. For example, the instructions 176 and 178 of FIG. 1 can be next in line to be executed by the switching element 112 of the same figure, followed by the execution of the instructions 172 and 174. The instructions 176 and 178 can be executed in parallel. Similarly, the instructions 172 and 174 can also be executed in parallel. The plurality of switch instructions per cycle can be mutually exclusive. The flow 600 continues with routing data through logical elements 650.

Figure 7:
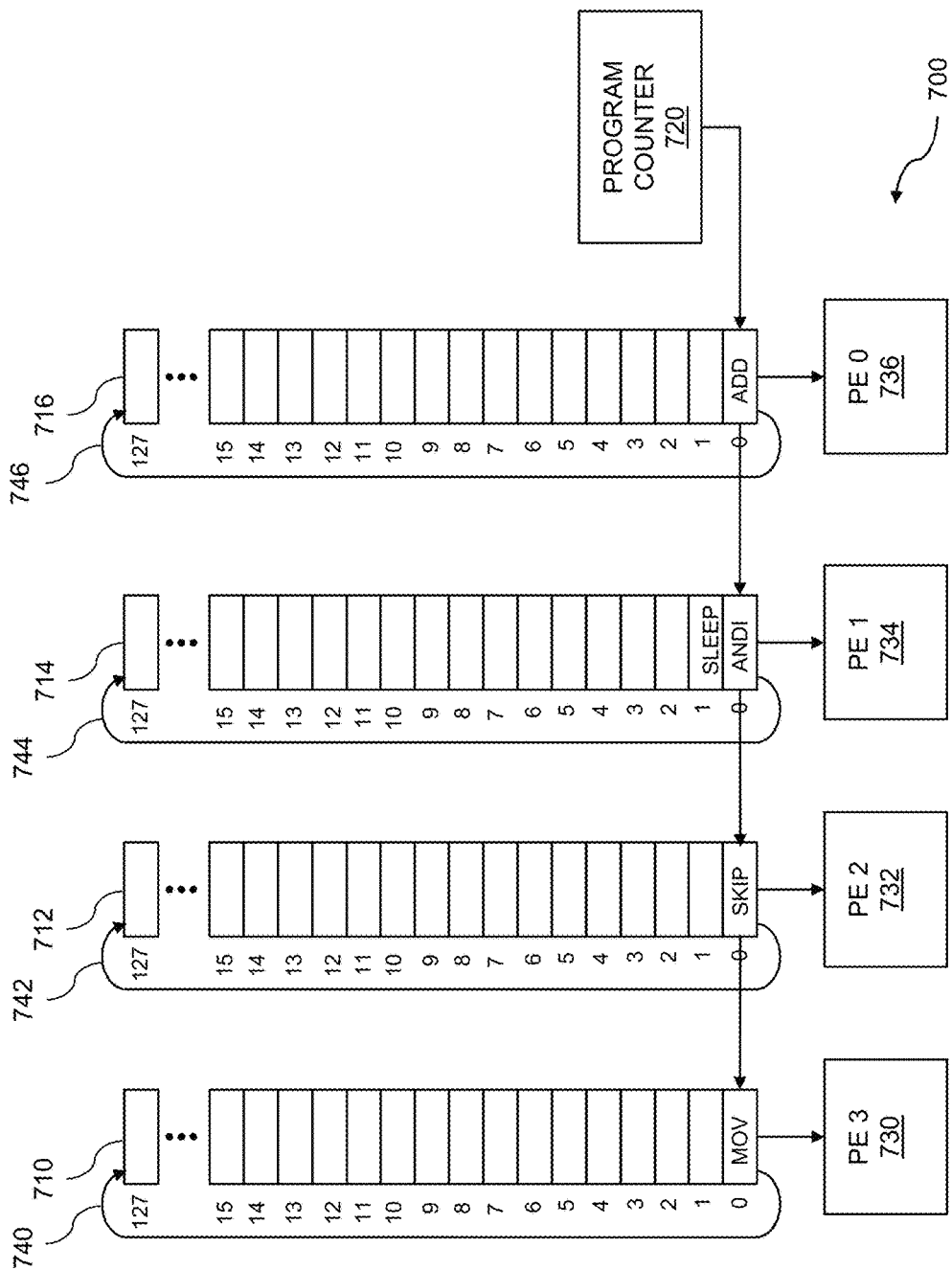
FIG. 7 shows an example instruction execution for processing elements.

FIG. 7 shows a diagram 700 indicating an example instruction execution for processing elements. In this embodiment, in addition to the main circular buffer for a cluster (for example, the buffer 202 of FIG. 2), an additional circular buffer is implemented for each processing element. A circular buffer 710 feeds a processing element 730. A circular buffer 712 feeds another processing element 732. A third circular buffer 714 feeds another processing element 734. A fourth circular buffer 716 feeds another processing element 736. The four processing elements 730, 732, 734, and 736 can represent a quad of processing elements. In embodiments, the processing elements 730, 732, 734, and 736 are controlled by instructions received from the circular buffers 710, 712, 714, and 716. The circular buffers can be implemented using feedback paths 740, 742, 744, and 746, respectively. In embodiments, the circular buffer (e.g. 202 of FIG. 2) can control the passing of data to a quad of processing elements through switching elements, where each of the quad of processing elements is controlled by four other circular buffers (e.g. 710, 712, 714, and 716) and where data is passed back through the switching elements from the quad of processing elements where the switching elements are again controlled by the main circular buffer. In embodiments, a program counter 720 is configured to point to the current instruction within a circular buffer. In these embodiments, the contents of the circular buffer are not shifted or copied to new locations on each instruction cycle. Rather, the program counter 720 is incremented in each cycle to point to a new location in the circular buffers. The circular buffers 710, 712, 714, and 716 can contain instructions for the processing elements. The instructions can include, but are not limited to, move instructions, skip instructions, logical AND instructions, logical AND-Invert (e.g. ANDI) instructions, logical OR instructions, shift instructions, sleep instructions, and so on. A sleep instruction can be usefully employed in numerous situations. The sleep state can be entered by an instruction within one of the processing elements. One or more of the processing elements can be in a sleep state at any given time. In some embodiments, a "skip" can be performed on an instruction and the instruction in the circular buffer can be ignored and the corresponding operation not performed. In embodiments, the circular buffers 710, 712, 714, and 716 have a length of 128 instructions, but other circular buffer lengths are also possible.

Figure 8:
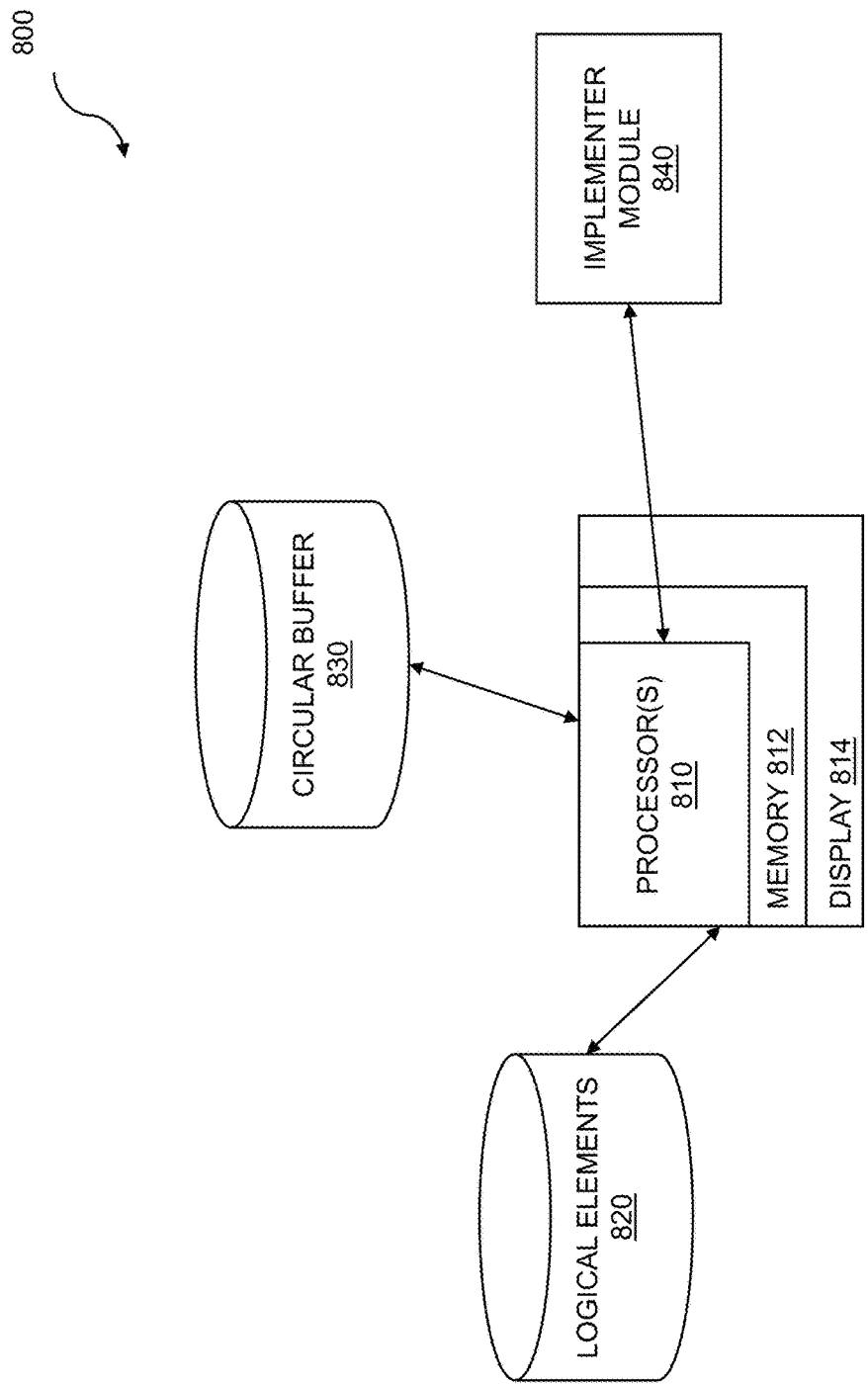
FIG. 8 is a system diagram for implementing processing elements.

FIG. 8 is a system diagram for implementing processing elements. The system 800 includes one or more processors 810 and a memory 812. The memory 812 can be used for storing instructions, for storing circuit designs, for storing logic designs, for system support, and the like. The one or more processors 810 can read in information regarding logical elements 820 and a circular buffer 830, and implement various programmable logic designs using a logic implementer module 840. Logical elements can be represented in the form of digital data stored on a storage medium such as a hard disk. The digital data can be in the form of a library or a database. The library or database can comprise a plurality of standard designs. Similarly, the circular buffer 830 can be represented in the form of digital data stored on a storage medium such as a hard disk. The circular buffer digital data can also be in the form of a library or database. In at least one embodiment, the implementer module 840 functions are accomplished by the one or more processors 810.

In embodiments, one or more of the logical elements 820, circular buffer 830, and implementer module 840 are interconnected via the Internet. Cloud computing can be used to design the switching fabric and plurality of logical elements. Information about the various designs can be shown on a display 814 which is attached to the one or more processors 810. The display 814 can be any electronic display, including but not limited to, a computer display, a laptop screen, a net-book screen, a tablet screen, a cell phone display, a mobile device display, a remote with a display, a television, a projector, and the like. The system 800 can include a computer program product embodied in a non-transitory computer readable medium for implementation of a logical calculation apparatus, the computer program product comprising: code for designing a switching fabric using: a plurality of logical elements; configurable connections between the logical elements; and a circular buffer controlling the configurable connections.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. An apparatus for data manipulation comprising:
   a plurality of logical elements;
   configurable connections between the plurality of logical elements; and
   a plurality of rotating circular buffers residing on a semiconductor chip where the plurality of circular buffers contain configuration instructions which control different configurable connections between the plurality of logical elements and dynamically change operation of the logical elements per cycle based on the rotating of the circular buffer and wherein the configuration instructions are pre-processed by a compiler and statically scheduled to avoid collisions among the plurality of logical elements.

2. The apparatus of claim 1 wherein the plurality of logical elements comprise one or more of switching elements, processing elements, or storage elements.

3. The apparatus of claim 1 wherein the plurality of circular buffers have differing lengths.

4. The apparatus of claim 3 wherein the plurality of circular buffers having differing lengths resynchronize with a zeroth pipeline stage for each of the plurality of circular buffers.

5. The apparatus of claim 1 wherein the configurable connections comprise a switching fabric.

6. The apparatus of claim 5 wherein the switching fabric includes fan-in and fan-out connections.

7. The apparatus of claim 1 wherein the configurable connections are time multiplexed.

8. The apparatus of claim 1 wherein the circular buffer is programmed and instructions are pre-processed to generate input to the circular buffer for dynamic programming.

9. The apparatus of claim 1 wherein the circular buffer controls passing data to a quad of processing elements through switching elements, where each of the quad of processing elements is controlled by four other circular buffers, where data is passed back through the switching elements from the quad of processing elements where the switching elements are again controlled by the circular buffer.

10. The apparatus of claim 1 wherein a column within the circular buffer can be skipped in a cycle.

11. The apparatus of claim 10 wherein not skipping indicates a valid instruction.

12. The apparatus of claim 1 wherein the plurality of logical elements includes a processing element that can be placed in a sleep state where the sleep state is exited based on data being valid.

13. The apparatus of claim 12 wherein the sleep state can be entered by an instruction within the processing element.

14. The apparatus of claim 13 wherein the sleep state can only be exited by stimulus external to the processing element and not based on programming of the processing element.

15. The apparatus of claim 14 wherein the sleep state is exited based on an instruction applied to a switching fabric.

16. The apparatus of claim 1 wherein the circular buffer comprises a plurality of switch instructions for the configurable connections.

17. The apparatus of claim 16 wherein the circular buffer comprises a plurality of switch instructions per cycle for the configurable connections.

18. The apparatus of claim 1 wherein the configurable connections provide three-dimensional routing.

19. The apparatus of claim 1 further comprising storage elements coupled to the configurable connections.

20. The apparatus of claim 19 wherein the storage elements store data while the configurable connections are busy with other data.

21. The apparatus of claim 1 wherein the configurable connections enable bypassing of neighboring logical elements.

22. The apparatus of claim 1 wherein the configurable connections comprise one or more of a fan-in, a fan-out, or a local storage.

23. The apparatus of claim 1 wherein the configurable connections route through one or more of silicon vias, two-dimensional connections, three-dimensional connections, or greater-than three-dimensional connections.

24. The apparatus of claim 1 wherein communication through the configurable connections is based on data being valid.

25. A computer-implemented method of logic implementation comprising:
   designing a switching fabric using:
      a plurality of logical elements;
      configurable connections between the plurality of logical elements; and
      a plurality of rotating circular buffers residing on a semiconductor chip where the plurality of circular buffers contain configuration instructions which control different configurable connections between the plurality of logical elements and dynamically change operation of the logical elements per cycle based on the rotating of the circular buffer and wherein the configuration instructions are pre-processed by a compiler and statically scheduled to avoid collisions among the plurality of logical elements.

26. A computer program product embodied in a non-transitory computer readable medium for implementation of a logical calculation apparatus, the computer program product comprising code which causes one or more processors to perform operations of:
   designing a switching fabric using:
      a plurality of logical elements;
      configurable connections between the plurality of logical elements; and
      a plurality of rotating circular buffers residing on a semiconductor chip where the plurality of circular buffers contain configuration instructions which control different configurable connections between the plurality of logical elements and dynamically change operation of the logical elements per cycle based on the rotating of the circular buffer and wherein the configuration instructions are pre-processed by a compiler and statically scheduled to avoid collisions among the plurality of logical elements.

27. The apparatus of claim 1 wherein the preprocessing inserts further instructions to prevent the collision.

28. The apparatus of claim 27 wherein the further instructions include one or more of a group of storage instructions, sleep instructions, and no-op instructions.

29. The apparatus of claim 1 further comprising replacing multiple instructions with a single fan-in instruction in the pre-processing.

30. The apparatus of claim 1 further comprising clusters of one or more processing elements, storage elements, and switching elements.

31. The apparatus of claim 30 wherein an additional circular buffer is implemented for each processing element.

32. The apparatus of claim 1 where collisions are avoided by intermediate data being stored in registers for pipeline cycles before being sent to an output port for a cluster.

33. The apparatus of claim 12 wherein the processing element wakes up from the sleep state when valid data is applied to inputs of the processing element.

* * * * *